(12) United States Patent
Grenon et al.

(10) Patent No.: US 10,409,154 B2
(45) Date of Patent: Sep. 10, 2019

(54) METHOD AND APPARATUS FOR PELLICLE REMOVAL

(71) Applicant: RAVE LLC, Delray Beach, FL (US)

(72) Inventors: Brian J. Grenon, North Fort Myers, FL (US); James Boyette, Lake Worth, FL (US); Alexander M. Figliolini, Lake Worth, FL (US)

(73) Assignee: Bruker Nano, Inc., Delray Beach, FL (US)

( * ) Notice: Subject to any disclaimer, the term of this patent is extended or adjusted under 35 U.S.C. 154(b) by 0 days.

(21) Appl. No.: 15/960,733

(22) Filed: Apr. 24, 2018

(65) Prior Publication Data

US 2018/0239243 A1 Aug. 23, 2018

Related U.S. Application Data

(63) Continuation of application No. 15/190,793, filed on Jun. 23, 2016, now Pat. No. 9,958,771.

(51) Int. Cl.
*G03F 1/64* (2012.01)
*G03F 7/20* (2006.01)

(52) U.S. Cl.
CPC ............ *G03F 1/64* (2013.01); *G03F 7/70983* (2013.01)

(58) Field of Classification Search
CPC .............................. G03F 1/64; G03F 7/70983
USPC ............................................................ 430/5
See application file for complete search history.

(56) References Cited

U.S. PATENT DOCUMENTS

| 4,255,216 A | 3/1981 | Conant et al. |
| 6,173,916 B1 | 1/2001 | Krone-Schmidt |
| 7,993,464 B2 | 8/2011 | Leclaire et al. |

FOREIGN PATENT DOCUMENTS

| EP | 0942325 A2 | 9/1999 |
| EP | 2796925 A2 | 10/2014 |
| JP | 4301638 A | 10/1992 |
| JP | 3006694 B2 | 2/2000 |
| JP | 2008-32981 A | 2/2008 |
| JP | 2008-304886 A | 12/2008 |
| JP | 2017-227861 A | 12/2017 |
| KR | 960042198 A | 12/1996 |
| KR | 20010084145 A | 9/2001 |
| KR | 20110077976 A | 7/2011 |
| WO | 03/007352 A1 | 1/2003 |
| WO | 2005/054336 A1 | 6/2005 |
| WO | 2008/001431 A1 | 1/2008 |

*Primary Examiner* — Christopher G Young
(74) *Attorney, Agent, or Firm* — BakerHostetler

(57) ABSTRACT

A method and apparatus for removing a pellicle from a photomask wherein the adhesive between the pellicle frame and photomask is cooled sufficiently to allow the adhesive property of the adhesive to diminish to the point where the adhesive will release from the photomask with little or no mechanical force and leaving minimal adhesive on the photomask. The adhesive is cooled by way of manifolds containing coolant being brought in contact with the pellicle frame or by way of a coolant spray nozzles spraying coolant directly onto the pellicle frame.

20 Claims, 5 Drawing Sheets

METHOD AND APPARATUS FOR PELLICLE REMOVAL

CROSS-REFERENCE TO RELATED APPLICATIONS

This application claims priority to U.S. patent application Ser. No. 15/190,793, entitled "Method and Apparatus for Pellicle Removal," filed Jun. 23, 2016, which will patent on May 1, 2018, as U.S. Pat. No. 9,958,771, the disclosure of which is hereby incorporated by reference in its entirety.

TECHNICAL FIELD

This patent disclosure relates generally to photomask manufacture. More particularly, the present invention relates to the removal of a pellicle from a photomask.

BACKGROUND

In the manufacturing of integrated circuit devices, photomasks, alternatively referred to as photoreticles or reticles, are used to project patterns for the integrated circuits on a semiconductor wafer. To protect the photomask from contamination, which would impart errors in the projected patterns, a pellicle comprised of a transparent polymer thin film contained within an aluminum or plastic frame can be affixed to one side of the photomask by an adhesive bond between the pellicle frame and the photomask.

During use of the pellicle it can become necessary to remove the pellicle for a number of reasons including repairing a defect detected in the photomask, removing haze that has formed on the photomask under the pellicle, replacing the pellicle due to mechanical damage or exposure damage. The method of removing the pellicle from the photomask has typically involved the application of mechanical force to the pellicle frame to separate it from the photomask. Problems encountered with mechanical separation, however, include incomplete adhesive removal and pellicle adhesive deposited in the pattern area of the photomask, referred to as stringers, both requiring time-consuming cleaning which can degrade the mask to the point of being unusable. Damages can also occur to the metal film on the photomask during mechanical separation requiring costly repair to the photomask or require a new photomask to be fabricated.

Alternative methods that have been used to remove the pellicle from photomasks include soaking the pelliclized photomask in a hot solvent to dissolve the adhesive. These processes are not ideal because they utilize flammable and/or toxic solvents. Another method that has been used is placing the pelliclized photomask on a hot plate to melt the adhesive before mechanically separating the pellicle from the photomask. This process often leaves large amounts of pellicle adhesive on the photomask requiring significant subsequent cleaning steps.

U.S. Pat. No. 4,255,216, entitled "Pellicle Ring Removal Method and Tool," describes a proposed solution to the problem of mechanical pellicle removal that utilizes coolant to bring the adhesive for the pellicle below its embrittlement temperature while also causing the glass photomask to contract at a different rate from the contraction of the pellicle ring and adhesive thereby aiding in the separation of the adhesive from the photomask. In the proposed solution of the '216 patent, the photomask is placed in the pellicle removal tool with the secured facing down and the photomask is forced upwards away from the pellicle upon separation of the adhesive from the photomask. Coolant is applied directly to the photomask on the opposite side of the pellicle and thus, the pellicle frame and adhesive are indirectly cooled by thermal transfer through the photomask. Because the quartz glass used for photomasks is generally selected for its temperature stability, the photomask is not an ideal conductive medium for providing cooling to the adhesive and pellicle frame.

An improved process and apparatus for pellicle removal is needed to further reduce or obviate the need for harsh chemical cleaning of photomasks after pellicle removal, reduces the re-pelliclization cycle time, and reduces damage to photomasks that occur as a result of damage to the metal layer or deposition of pellicle adhesive in the mask pattern.

SUMMARY

In one aspect, the disclosure describes a method of removing a pellicle from a photomask. The method includes the steps of cooling the adhesive between a frame of the pellicle and the photomask. In this method, the step of cooling the adhesive includes the steps of insulating a portion of the photomask and cooling a frame of the pellicle.

In another aspect, the disclosure describes an apparatus for separating a pellicle from a photomask. The apparatus includes a first manifold containing cooling fluid, wherein the first manifold is placed in contact with a first portion of a frame of the pellicle. The apparatus also includes adjustable supports, wherein the adjustable supports secure the first manifold relative to the pellicle frame and the photomask.

In yet another aspect, the disclosure describes an apparatus for separating a pellicle from a photomask. The apparatus includes a first coolant spray nozzle, wherein the first coolant spray nozzle is oriented to spray coolant onto a first portion of a frame of the pellicle. The apparatus also includes adjustable supports, wherein the adjustable supports secure the pellicle relative to the coolant spray nozzle. The apparatus further includes a barrier, wherein the insulator is oriented to shield a portion of the photomask from the spray coolant.

DETAILED DESCRIPTION

Figure 1:
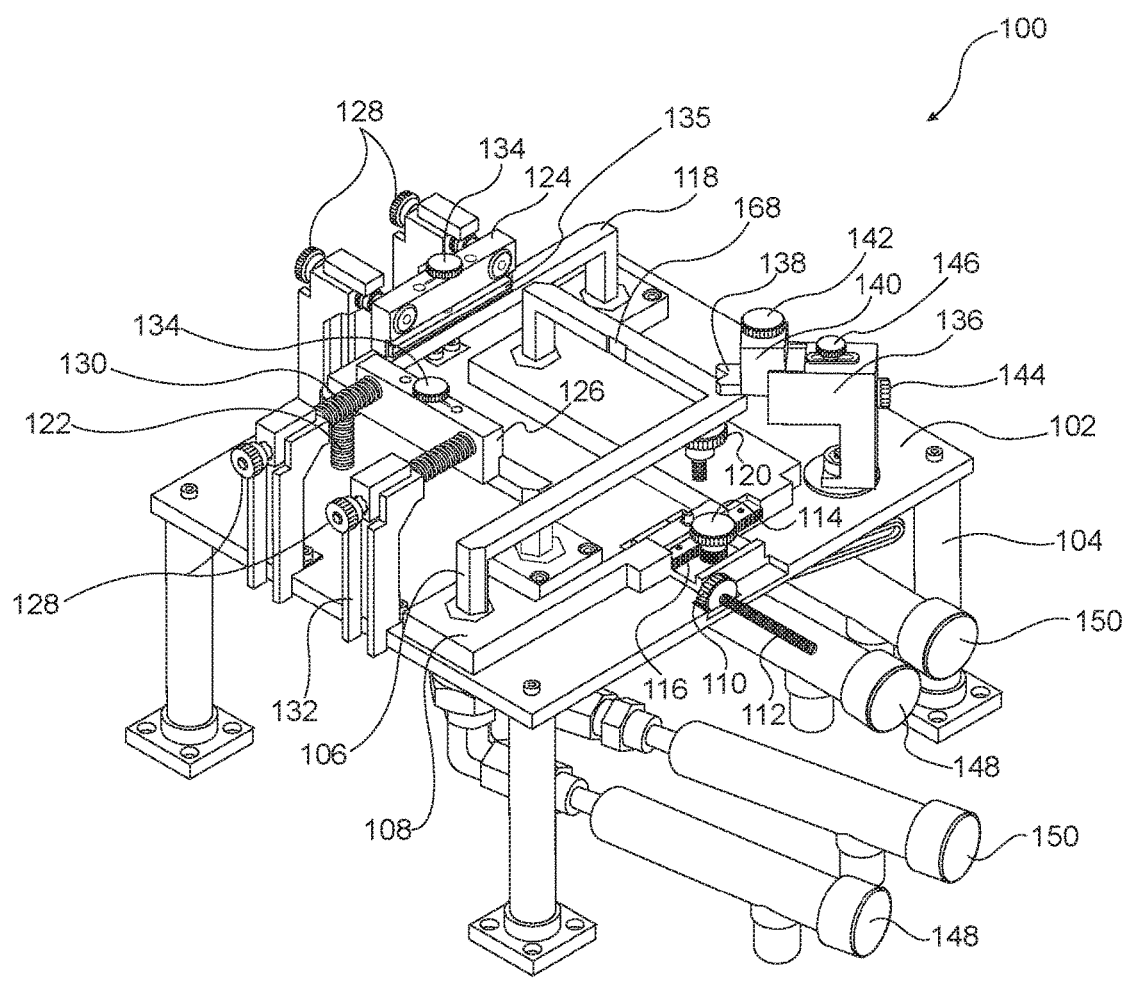
FIG. 1 is a top perspective view of an exemplary apparatus for removal of a pellicle from a photomask in accordance with an aspect of the present disclosure.

Now referring to the drawings, wherein like reference numbers refer to like elements, there is illustrated a pellicle removal apparatus 100 in accordance with a first aspect of the present disclosure. The apparatus 100 includes a base 102 supported by four support legs 104 onto which various adjustable supports are provided. As depicted in this aspect of the disclosure, a first "L-shaped" manifold 106 is mounted on a sled 108 so that it can be moved along the base in a first direction by rotation of a screw knob 110 connected to a threaded rod 112 provided in a threaded hole in the sled 108. The manifold 106 can be moved in a second direction, normal to the first direction, by rotation of a pinion gear 114 that engages with a rack 116 affixed to the sled 108. A second L-shaped manifold 118 is rigidly affixed to the base 102 so that the first manifold 106 and second manifold 118 form a rectangular enclosure. Support arms 106, 118 provide support for the corners of the L-shaped manifolds and can be adjusted, respectively, by rotation of supports 120, 122 affixed to threaded rods screwed into the base 102 to level the manifolds relative to each other.

Support plates 124, 126 are provided above the manifolds 106, 118 parallel to two sides of the base 102 and can be moved toward and away from the center of the base by operation of compression springs 130. The compression springs 130 are supported around shoulder screws 128 that are connected to the support plates 124, 126 at one end and allowed to slide freely through the support stanchions 132. The support plates include engagement pieces 135 that can be moved upwards or downwards relative to the base by rotation of a knob 134 connected to a threaded rod (not shown) that screws into the engagement pieces. The support plates 124, 126 are pressed outward away from the center of the base, compressing the springs 130 to allow loading the photomask into the apparatus.

A separate support stanchion 136 is affixed to the base 102 such that the stanchion can rotate around an axis normal to the plane of the base 102. A v-grooved jig 138 is mounted to the rotatable support stanchion 136 such that it can be moved upwards and downwards within a housing 140 by rotation of a knob 142 connected to a threaded rod (not shown) that is affixed to the v-grooved jig 138 in a manner that translates rotational movement to lateral movement of the jig. The housing 140 can also be moved outward and inward relative to the stanchion 136 by rotation of a knob 144 affixed to a threaded rod (not shown) that is screwed into a threaded hole in the housing 140. The position of the housing 140 can be fixed relative to the stanchion by means of a threaded locking knob 146.

Figure 2:
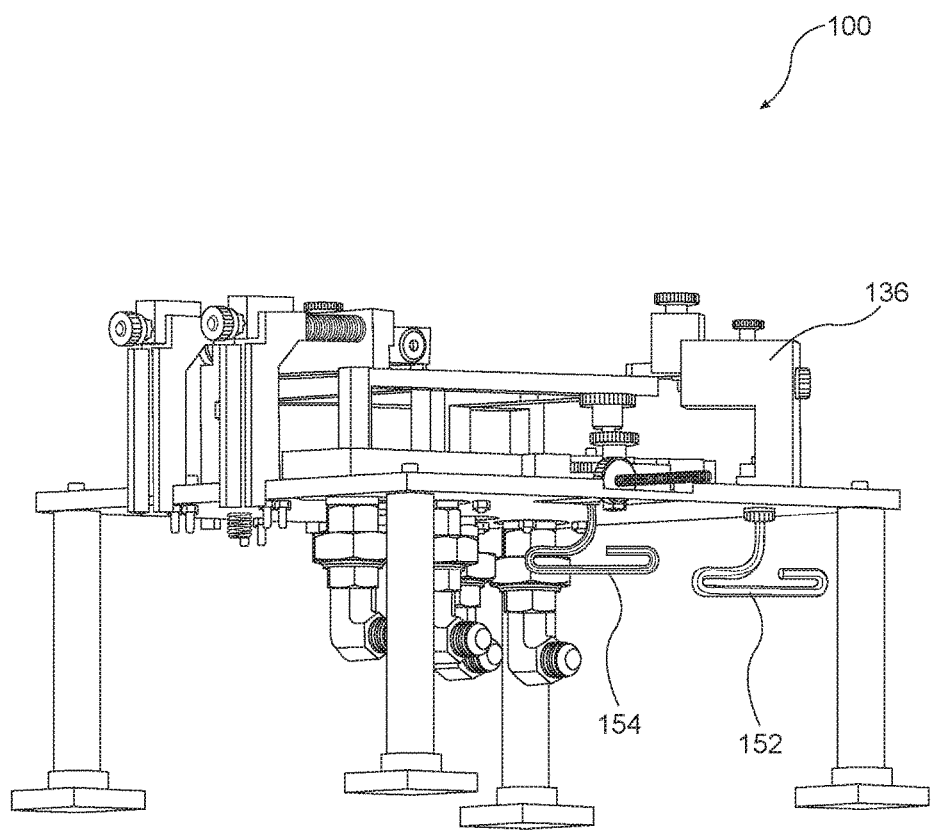
FIG. 2 is a side perspective view of the apparatus of FIG. 1.

Each manifold 106, 118 is provided with an intake 148 and exhaust 150 supply line. As will be readily understood, the intake and exhaust supply lines 148, 150 include various fittings and supply hoses, only part of which are shown in FIG. 1, to connect the pellicle removal apparatus 100 to a supply of coolant and the a reservoir for collection of the coolant after passing through the manifolds 106, 118. In a preferred embodiment, liquid nitrogen is used as the coolant although any other suitable coolant can be used including argon, oxygen, hydrogen, helium, fluorine, methane, neon, and carbon monoxide. It is desirable that the coolant utilized lower the temperature of the adhesive to or below the point where its adhesive quality is diminished sufficient that it releases readily from the surface of the photomask and remains on the surface of the pellicle frame. Portions of the intake and exhaust supply lines have been removed from the view of the pellicle removal apparatus 100 in FIG. 2. As shown in FIG. 2, the pellicle removal apparatus includes a handle 152 that can be rotated to loosen the stanchion 136 and allow it to rotate normal to the base 102 or can be tightened to prevent rotational movement of the stanchion 136. Similarly, a handle 154 is included that can be rotated normal to the base 102 to allow movement of the sled 108 or lock it in place.

Figure 3:
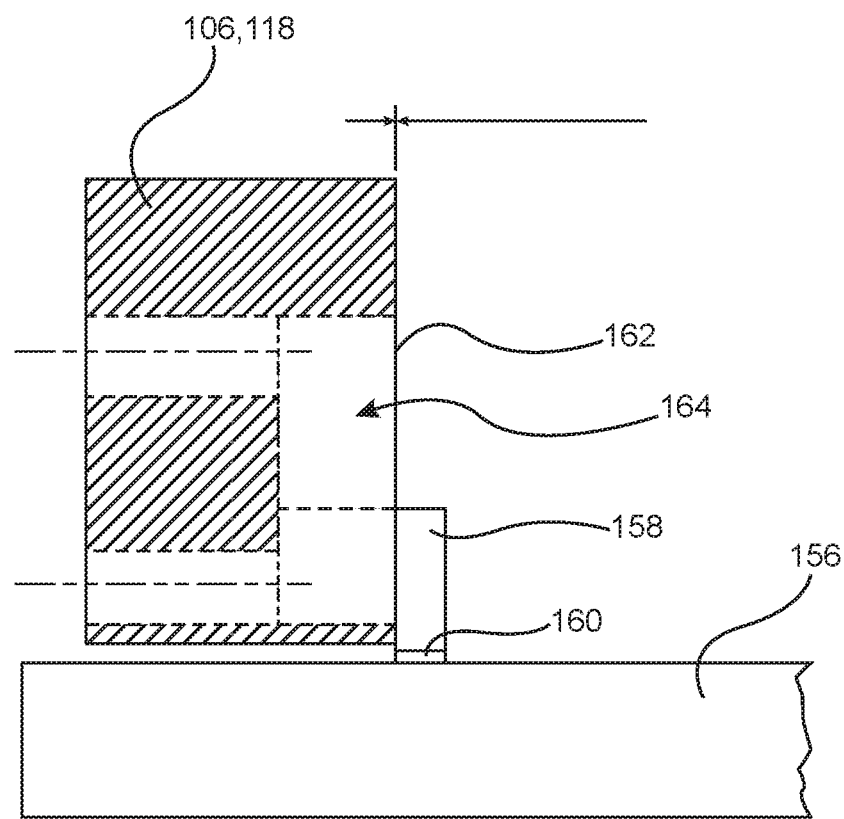
FIG. 3 is a partial cross-sectional side view of a cooling manifold of FIG. 1 engaged with a photomask and pellicle.

As depicted in FIG. 3, a photomask 156 will be provided with a pellicle having a frame 158 that typically ranges from 3 millimeters in height to 6.35 millimeters in height. Other typical pellicle frame heights are 3.15, 4, 5 and 6 millimeters. The pellicle frame 158 is secured to the photomask 156 by an adhesive 160. The construction and orientation of the manifold 106, 118 during operation is such that it can accommodate pellicle frames of any height. As shown in FIG. 3, the manifolds 106, 118 include a thin wall section 162 that forms part of the enclosed coolant fluid passage 164 of the manifolds 106, 118 and which is pressed against the pellicle frame 158 to allow thermal transfer cooling the pellicle frame and adhesive 160. In a preferred embodiment, the manifolds 106, 118 are 3D printed from titanium and the thin wall section 162 of the manifolds 106, 118 have a thickness in the range of 0.005 inches to 0.13 inches and preferably is 0.06 inches to allow the creation of a notch 168 in at least one manifold 106. Titanium is used in a preferred embodiment because it has a high heat transfer rate and low coefficient of thermal expansion. The strength of titanium also allows reduction of the thickness of the thin wall section 162 to increase the transfer of heat from the pellicle frame to the coolant while maintaining sufficient strength to prevent damage to the manifold during operation. In alternative embodiments, the manifolds are constructed of a material having a low coefficient of expansion such as iron-nickel alloys or stainless steel. Other embodiments, that achieve the purposes of the present disclosure and reduce overall cost, include a combination of materials used in the manufacture of the manifolds 106, 118 such as titanium for use in the thin wall section 162 and stainless steel for the balance of the manifold. In an alternative embodiment, weep holes are provided in the manifolds 106, 118 to allow the coolant to directly contact the pellicle frame to accelerate cooling.

In operation, the photomask 156 which is generally rectangular in shape is secured on two sides by the support plates 124, 126 and in the opposite corner by the v-grooved jig 138. As will be readily understood, photomasks of various sizes can be held in the apparatus by adjustment of the support plates 124, 126 and v-grooved jig 138 relative to the base 102. In the implementation of this embodiment of the disclosure, the photomask 156 is held in the apparatus 100 with the pellicle facing down and the engagement pieces 135 and v-grooved jig 138 are adjusted upwards or downwards to ensure that the manifolds 106, 118 do not touch the photomask while also adjusting the engagement of the L-shaped manifolds 106, 118 with the pellicle frame 158. In a preferred embodiment, faster release times of the pellicle frame 158 from the photomask 156 is achieved by maximizing the contact between the manifolds 106, 118 with the pellicle frame 158. Pellicle frames 158 are provided with vent holes with a filter (not shown) along the edge to allow pressure equalization in the cavity between the pellicle and photomask. The notch 168 is provided in at least one manifold 106 that is aligned with the filter of the pellicle during operation to allow pressure equalization to occur. In applications where it is not necessary to provide a notch 168 aligned with a vent hole in the pellicle frame a thinner profile wall 162 of the manifold 106 is generally preferred to increase cooling capacity. In one embodiment, when the pellicle frame is released from the photomask by operation of the apparatus, the sled 108 will be retracted to release the grip on the pellicle and it will be allowed to fall away. In an alternate embodiment, the photomask can be moved away from the pellicle frame by raising the engagement pieces 135 and v-grooved jig 138.

Figure 4:
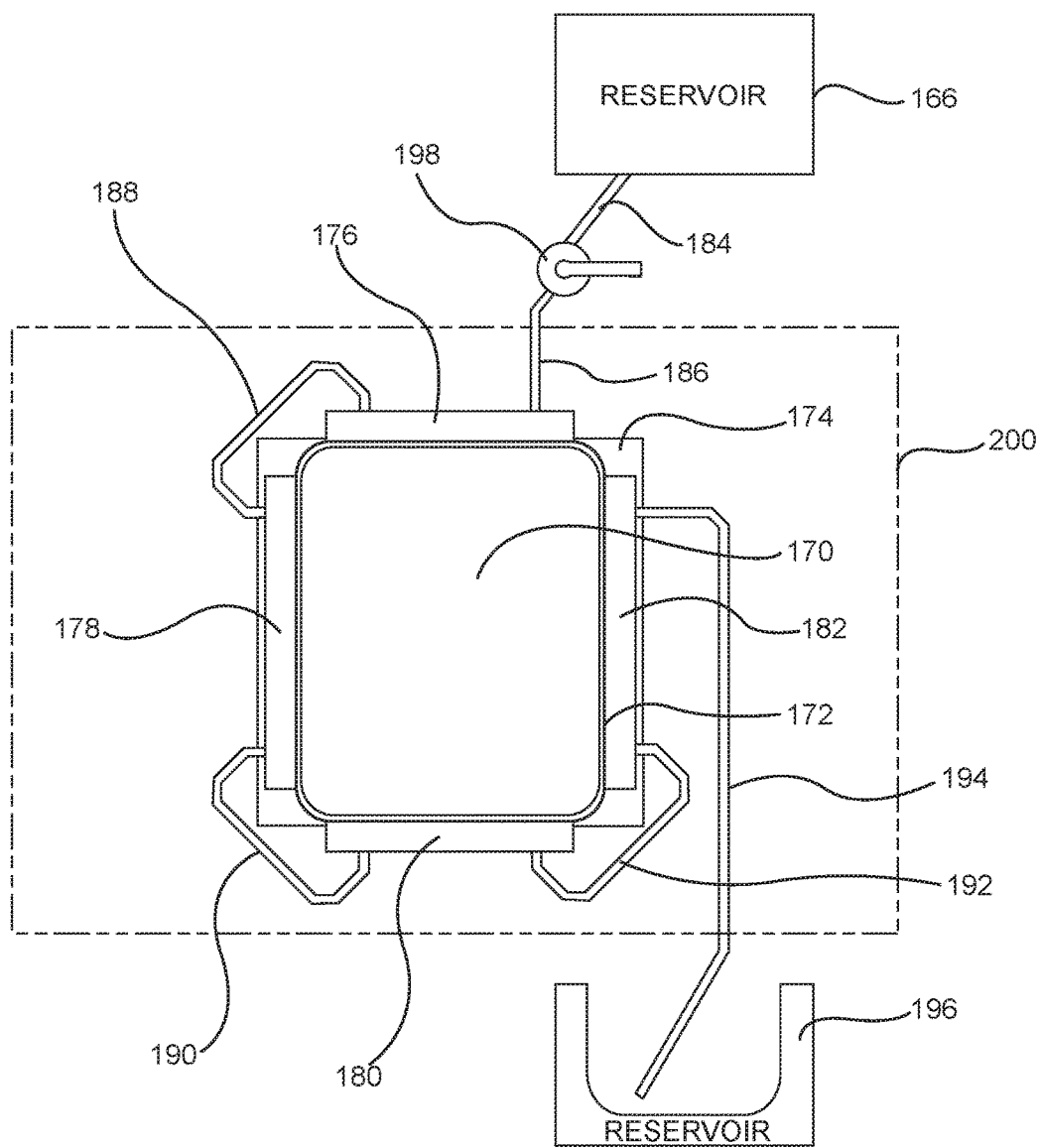
FIG. 4 is a schematic representation of a coolant distribution system in accordance with one aspect of the present disclosure.

An alternative embodiment is depicted in FIG. 4 in which a pellicle 170 having a pellicle frame 172 that is mounted to a photomask 174 is depicted. In this embodiment, the pellicle frame 172 is engaged on each of the four sides by separate manifolds 176, 178, 189, 182. The use of separate manifolds allows the pellicle removal apparatus to accommodate a wider range of pellicle sizes. Coolant is supplied from an appropriate reservoir, such as a cryogenic storage dewar 166, through supply lines 184, 186 to a first manifold 176. In this embodiment, coolant is supplied serially to each successive manifold 178, 180, 182 via supply lines 188, 190, 192 connecting the manifolds. It will be recognized that, in alternative embodiments, coolant can be provided in parallel to the manifolds. Coolant flows from the last manifold 182 in the series to a collection reservoir 196 such as an open dewar. As depicted in FIG. 4, a valve is provided to control the supply of coolant to the manifolds.

As also depicted in FIG. 4, the pellicle removal apparatus is contained within a dew point controlled environment 200 such as a glove box, represented by dashed lines in FIG. 4, to prevent condensation from forming during the process and to protect the photomask from contamination. In a preferred embodiment, the dew point controlled environment is nitrogen filled. Similarly, the pellicle removal apparatus 100 of FIG. 1 can also be provided in a dew point controlled environment. In alternative embodiments, the placement and securing of the photomask and pellicle frame in the pellicle removal apparatus of FIG. 1 and FIG. 4, as well as the separation of the pellicle from the photomask, is automated using robotic equipment contained in dew point controlled enclosure 200.

In operation, a photomask with an attached pellicle is secured within the pellicle removal apparatus. In a preferred embodiment, a flow of coolant is supplied to the manifolds for sufficient time to allow the adhesive to release from the photomask leaving little or no residue. In an alternate embodiment, the adhesive is cooled to an embrittlement temperature at which the pellicle frame and adhesive can be detached from the photomask by mechanical force leaving little or no residue. Separation of the pellicle frame and adhesive are accomplished as a result of one or more of the of the following factors working alone or in combination: (1) the adhesive force of the adhesive being greatly diminished by the coolant; (2) the different coefficient of thermal expansion and contraction of the pellicle frame, adhesive and photomask applying a strain between the adhesive and the photomask; and (3) movement of the pellicle frame or photomask relative to the device, such as by movement of the manifold relative to the pellicle frame, providing a strain force between the adhesive and photomask.

The methods of the present disclosure can be employed, for example, by reduction of the temperature of the adhesive to the point where the adhesive separates from the photomask with little or no strain being applied to the pellicle, as would be the case where the pellicle frame and photomask have similar coefficients of thermal expansion and contraction. The methods of the present disclosure can also be employed, for example, by reducing the temperature of the adhesive to an embrittlement point where the adhesive would not separate from the photomask but for the strain generated by the different coefficient of thermal expansion and contraction of the pellicle frame, adhesive and photomask. Because the methods and apparatus of the present disclosure can be employed to utilize each of the foregoing factors alone or in combination, flexibility is provided in the selection of coolants, methods for the application of the coolants and the time required for the pellicle removal.

In a preferred embodiment, the coolant is nitrogen and the manifold containing the coolant is placed in contact with the pellicle frame for a period of three to five minutes. The amount of time during which the pellicle frame is cooled will be impacted by the type of coolant, the mechanism employed for applying the coolant to the pellicle frame, and the coefficient of thermal expansion of the particular pellicle, adhesive and photomask being operated upon and these can be readily determined for different applications by the use of the methods and apparatus of the present disclosure. In an exemplary photomask the acrylic adhesive will have a coefficient of thermal expansion and contraction of approximately $75 \times 10^{-6}$ m/m K°, an aluminum pellicle frame would have a coefficient of thermal expansion and contraction of approximately $22 \times 10^{-6}$ m/m K°, and the quartz photomask would have a coefficient of thermal expansion and contraction of approximately $0.77 \times 10^{-6}$ m/m K°. As depicted in FIG. 3, in a preferred embodiment, the manifold 106, 118 contacts the pellicle frame 158 and adhesive 160 but does not come in contact with the photomask 156 thus protecting the photomask from damage by the manifold. In addition, by spacing the manifold away from the photomask an insulating air-gap separation between the manifold and photomask is created, the pellicle frame cools more rapidly than the photomask providing a larger differential between contraction of the pellicle frame and adhesive from that of the photomask and allowing the separation to occur more rapidly.

Figure 5:
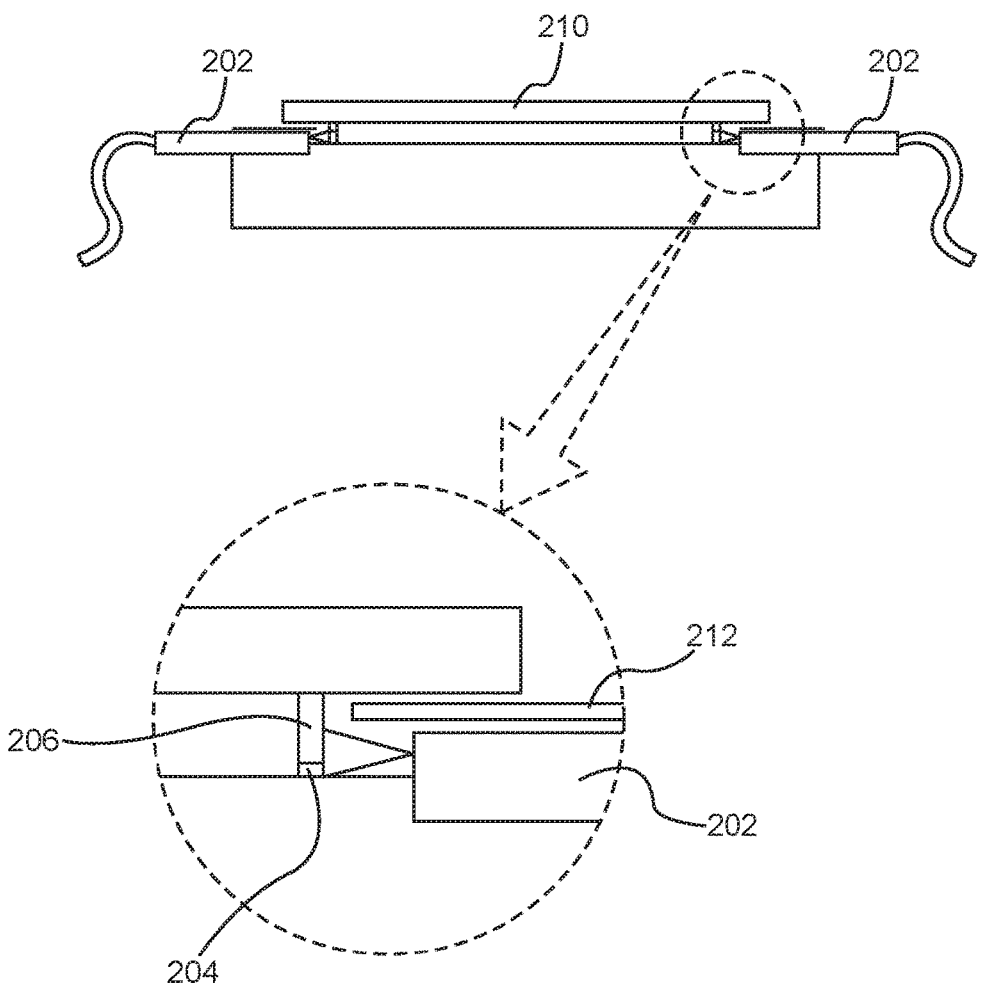
FIG. 5 is a schematic representation of an alternate aspect of the present pellicle removal method and apparatus of the present disclosure.

In an alternative embodiment, shown in FIG. 5, one or more spray nozzles 202 can be used to spray coolant at the pellicle frame 204 and adhesive 206. Although only shown on two sides, it should be understood that spray nozzles would preferably be positioned to spray at all four sides of the pellicle 204. An exemplary spray nozzle suited for this application is the Eco-Snow Systems $CO_2$ spray nozzle 20-44220-001-02 described in U.S. Pat. No. 6,173,916. In this embodiment, the Pellicle is placed against a vacuum chuck 208 that holds the pellicle during the removal process. The vacuum chuck 208 reduces potential contamination of the photomask 210 if the pellicle is damaged during removal. Because this embodiment does not require mechanical securing of the pellicle in place, exact registration of the pellicle in the apparatus is not critical allowing the removal process to be carried out more rapidly. In some embodiments, the gases utilized include CO2, N2, hydrofluorocarbons, and R12 and other chlorofluorocarbons. It will be readily understood that the foregoing list of gases is only exemplary and any other gas can be used as a coolant in this alternate embodiment that achieves sufficiently low temperature during its expansion as it leaves the spray nozzle and impinges on the pellicle to achieve the desired separation of the adhesive from the photomask. Moreover, by using a vacuum chuck 208 that is as large as the largest pellicle, any size and shape pellicle can be accommodated in this apparatus. After placement of the pellicle on the vacuum chuck 208, the spray nozzles 202 can be positioned relative to the pellicle frame 204 by adjustable supports. It will be readily understood that positioning of the spray nozzles with respect to the pellicle can be by manual or automated processes and equipment. In an alternative embodiment, an insulator or barrier 212 can be inserted between the photomask 210 and the spray nozzle 202 to limit the cooling of the photomask 210.

Although described with particular spatial orientation of the pelliclized photomask with respect to the pellicle removal apparatus for purposes of the embodiments of the foregoing description, it will be readily understood that such orientation is not necessary in employing the inventions described herein. The inventions described herein may be utilized in an apparatus in which the photomask is mounted with the pellicle facing upward, to the side, or in any desired spatial direction. In addition, although described in the foregoing embodiments as having particular structure to support and adjust the relative placement of coolant with respect to the pellicle and photomask, it will be readily understood that other structure can be used to achieve the same result without departing from the spirit and scope of the present inventions.

It will also be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

We claim:

1. A method of removing an adhesive securing a pellicle frame to a photomask from the photomask comprising the steps of:
    arranging the pellicle frame in proximity to a cooling system;
    insulating a portion of the photomask, wherein the portion of the photomask is insulated from a coolant; and
    cooling the adhesive securing the pellicle frame to the photomask to an embrittlement temperature of the adhesive.

2. The method of claim 1, wherein the adhesive force of the adhesive is diminished to the point that the adhesive can be removed with no strain being applied to the pellicle.

3. The method of claim 1, wherein a strain force is applied between the adhesive and the photomask.

4. The method of claim 2, wherein the strain force comprises a movement of the pellicle frame.

5. The method of claim 1, wherein the cooling step comprises the step of spraying the coolant onto the adhesive.

6. The method of claim 5, further comprising the step of insulating the photomask to limit the cooling of the photomask.

7. The method of claim 1, wherein the cooling step utilizes carbon dioxide.

8. The method of claim 1, wherein the cooling step utilizes a hydrofluorocarbon.

9. The method of claim 1, wherein the cooling step utilizes a cryogenic coolant.

10. The method of claim 9, wherein the cryogenic coolant is selected from the group consisting essentially of nitrogen, argon, oxygen, hydrogen, helium, fluorine, methane, neon, carbon monoxide.

11. The method of claim 10, wherein the cooling step comprises the steps of:
    thermally coupling a manifold to the pellicle frame; and
    flowing the cryogenic fluid through the manifold.

12. A method comprising the steps of:
    selectively cooling a frame of a pellicle to reduce adhesion in an adhesive between the frame and a photomask, wherein a portion of the photomask is insulated from a coolant; and
    removing the frame from the photomask in response to the reduced adhesion.

13. The method of claim 12, wherein the adhesive force of the adhesive is diminished to the point that the adhesive can be removed with no strain being applied to the pellicle.

14. The method of claim 13, wherein a strain force is applied between the adhesive and the photomask.

15. The method of claim 14, wherein the strain force comprises a movement of the pellicle frame.

16. The method of claim 12, wherein the selectively cooling step comprises the step of spraying the coolant onto the adhesive.

17. An apparatus for separating a pellicle from a photomask, comprising:
    a first manifold containing cooling fluid; and
    first adjustable supports, wherein the first adjustable supports secure a pellicle frame to the first manifold to selectively cool the pellicle frame and reduce adhesion in an adhesive between the pellicle frame and the photomask, wherein a portion of the photomask is insulated from the cooling fluid.

18. The apparatus of claim 17, wherein the first adjustable supports adjust the orientation of the manifold.

19. The apparatus of claim 18, further comprising second adjustable supports, wherein the second adjustable supports secure the photomask in place.

20. The apparatus of claim 19, further comprising means for applying a strain force to the pellicle frame.

* * * * *